(12) United States Patent
Sudijono et al.

(10) Patent No.: US 6,706,625 B1
(45) Date of Patent: Mar. 16, 2004

(54) COPPER RECESS FORMATION USING CHEMICAL PROCESS FOR FABRICATING BARRIER CAP FOR LINES AND VIAS

(75) Inventors: John Sudijono, Singapore (SG); Liang Ch O Hsia, Singapore (SG); Liu Wu Ping, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/313,499

(22) Filed: Dec. 6, 2002

(51) Int. Cl.$^7$ ......................................... H01L 21/4763
(52) U.S. Cl. .................. 438/637; 438/619; 438/692; 438/687; 438/672
(58) Field of Search ................. 438/637–640, 438/672–675, 687, 692, 619

(56) References Cited

U.S. PATENT DOCUMENTS

| | | | |
|---|---|---|---|
| 5,744,376 A | 4/1998 | Chan et al. | |
| 6,093,647 A | 7/2000 | Yu et al. | 438/687 |
| 6,114,243 A | 9/2000 | Gupta et al. | 438/687 |
| 6,274,499 B1 | 8/2001 | Gupta et al. | 438/692 |
| 6,291,332 B1 | 9/2001 | Yu et al. | 438/618 |
| 6,297,158 B1 | 10/2001 | Liu et al. | 438/687 |
| 6,383,917 B1 * | 5/2002 | Cox | 438/637 |
| 6,537,912 B1 * | 3/2003 | Agarwal | 438/687 |
| 6,537,913 B2 * | 3/2003 | Modak | 438/687 |

* cited by examiner

Primary Examiner—Dung Le
(74) Attorney, Agent, or Firm—George O. Saile; Rosemary L. S. Pike; Stephen G. Stanton

(57) ABSTRACT

A method of fabricating a planarized barrier cap layer over a metal structure comprising the following steps. A substrate having an opening formed therein is provided. The substrate having an upper surface. A planarized metal structure is formed within the opening. The planarized metal structure being substantially planar with the upper surface of the substrate. A portion of the planarized metal structure is removed using a reverse-electrochemical plating process to recess the metal structure from the upper surface of the substrate. A barrier cap layer is formed over the substrate and the recessed metal structure. The excess of the barrier cap layer is removed from over the substrate by a planarization process to form the planarized barrier cap layer over the metal structure.

64 Claims, 3 Drawing Sheets

COPPER RECESS FORMATION USING CHEMICAL PROCESS FOR FABRICATING BARRIER CAP FOR LINES AND VIAS

FIELD OF THE INVENTION

The present invention relates generally to fabrication of semiconductor devices, and more specifically to methods of fabricating a barrier cap layer for lines and vias.

BACKGROUND OF THE INVENTION

The current practice uses a copper (Cu)-chemical mechanical polishing (CMP) to planarize the copper surface after filling the line/via by copper electrochemical plating. The Cu-CMP stops on the oxide. A post-CMP silicon nitride (SiN) overlying cap layer is a common integration approach as a barrier layer for the next damascene structure.

U.S. Pat. No. 6,114,243 to Gupta et al. describes: 1) formation of a copper interconnect; 2) a copper-CMP; 3) etch-back of the copper interconnect; and 4) formation of a conductive barrier layer.

U.S. Pat. No. 6,291,332 B1 to Yu et al. describes a reverse plating technique.

U.S. Pat. No. 6,093,647 to Yu et al. describes another reverse plating technique.

U.S. Pat. No. 6,297,158 B1 to Liu et al. describes a copper dual damascene process using electrochemical plating.

U.S. Pat. No. 6,274,499 B1 to Gupta et al. describes a dielectric cap layer over a copper interconnect.

U.S. Pat. No. 5,744,376 to Chan et al. describes a copper interconnect with a top barrier layer.

SUMMARY OF THE INVENTION

Accordingly, it is an object of the present invention to provide an method of fabricating barrier cap layers over lines and vias.

Other objects will appear hereinafter.

It has now been discovered that the above and other objects of the present invention may be accomplished in the following manner. Specifically, a substrate having an opening formed therein is provided. The substrate having an upper surface. A planarized metal structure is formed within the opening. The planarized metal structure being substantially planar with the upper surface of the substrate. A portion of the planarized metal structure is removed using a reverse-electrochemical plating process to recess the metal structure from the upper surface of the substrate. A barrier cap layer is formed over the substrate and the recessed metal structure. The excess of the barrier cap layer is removed from over the substrate by a planarization process to form the planarized barrier cap layer over the metal structure.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Initial Structure

Figure 1:
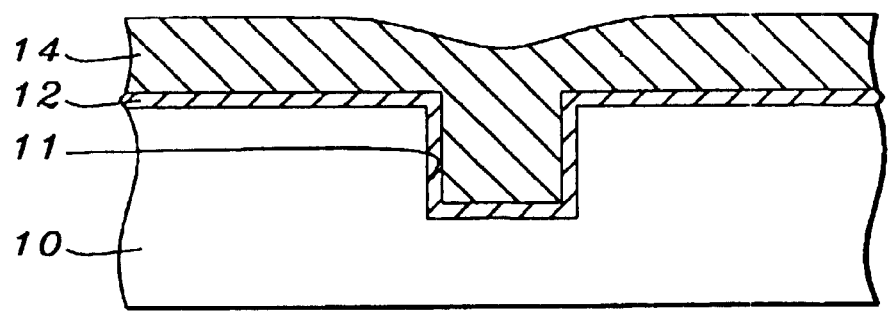
FIGS. 1 to 8 schematically illustrate in cross-sectional representation a preferred embodiment of the present invention.

As shown in FIG. 1, substrate 10 has opening 11 formed therein.

Substrate 10 is preferably a silicon substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Opening 11 may be, for example, a line opening or a via opening.

A line/via barrier layer 12 is formed over substrate 10, lining opening 11. Line/via barrier layer 12 has a thickness of preferably from about 100 to 500 Å and more preferably from about 200 to 350 Å. Line/via barrier layer 12 is preferably comprised of tantalum (Ta), tantalum/tantalum nitride (Ta/TaN), TaN, titanium nitride (TiN), tungsten nitride (WN), Ti/W or W, is more preferably Ta or Ta/TaN and is most preferably Ta.

Metal layer 14 is formed over line/via barrier layer 12 lined substrate 10, filling line/via opening 11 preferably by an electrochemical plating process (ECP). Metal layer 14 is preferably comprised of copper or copper alloy such as Cu(Sn) or Cu(Mg) and is more preferably copper (Cu) as will be used for illustrative purposes hereafter. The edge bead removal step (EBR step) after the ECP process is skipped in order to preserve the Cu seed for the subsequent reverse-plating step.

Planarization of Copper Layer 14

Figure 2:
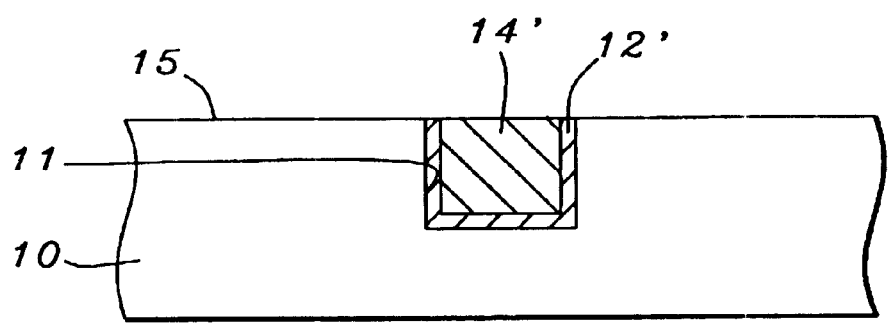

As shown in FIG. 2, the excess of copper layer 14 and line/via barrier layer 12 are removed from over substrate 20 by a planarization process to form a planarized copper line/via 14' having a patterned line/via barrier layer 12'. The planarization process is preferably a chemical mechanical polishing (CMP) process.

Reverse-ECP Process to Recess Planarized Copper Line/Via 14'

Figure 3:
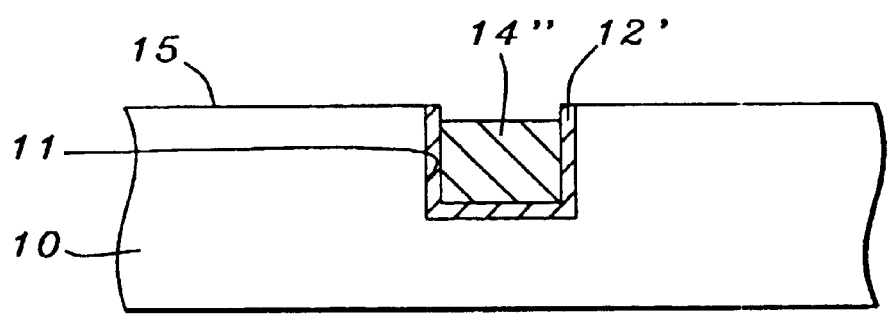

As shown in FIG. 3, a reverse-electrochemical plating (ECP) process (reverse-ECP process) is then employed, that is the ECP current is reversed, to remove an amount of the exposed copper within the planarized copper line/via 14' to recess the copper line/via 14' preferably from about 100 to 500 Å and more preferably from about 200 to 350 Å from the top surface 15 of substrate 10 to form a recessed copper line/via 14". The reverse-ECP process requires only a copper sulfide bath—no organic additives are necessary. The reverse-ECP process allows the wafer to be the anode and the Cu atoms to be selectively removed from the trenches (opening 11).

Formation of Barrier Cap Layer 16

Figure 4:
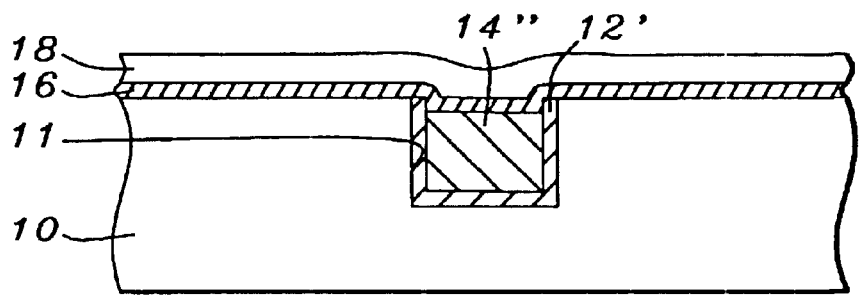

As shown in FIG. 4, a barrier cap layer 16 is formed over the substrate 10 and over the recessed copper line/via 14". Barrier cap layer 16 is formed to a thickness of preferably from about 100 to 500 Å and more preferably from about 100 to 250 Å. Barrier cap layer 16 is preferably comprised of tantalum (Ta), tantalum/tantalum nitride (Ta/TaN), TaN, TiN, W, Ti/W or WN is more preferably Ta or Ta/TaN and is most preferably Ta.

Optionally, a top layer 18 may be formed over the barrier cap layer 16 to improve the subsequent planarization/removal of the excess barrier cap layer 16 from over the substrate 10. Optional layer 18 is preferably comprised of Cu, Cu(Sn), Cu(Mg) or a copper alloy and is more preferably Cu. Optional top layer 18 is preferably formed to a thickness of from about 1000 to 6000 Å and more preferably from about 2000 to 3000 Å.

Planarization of Barrier Cap Layer 16

Figure 5:
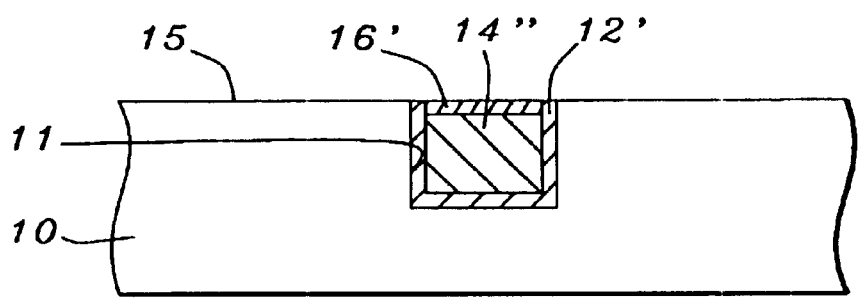

As shown in FIG. 5, the excess of the barrier cap layer 16 (and the optional top layer 18 if used) is removed from over the substrate 10 to form a planarized barrier cap layer 16' essentially planar with the top surface 15 of substrate 10 and over the recessed copper line/via 14". This planarization may be a standard copper chemical mechanical polish (CMP) with no special processing required.

Further processing may then proceed.

Formation of Dielectric Layer Stack 17

Figure 6:
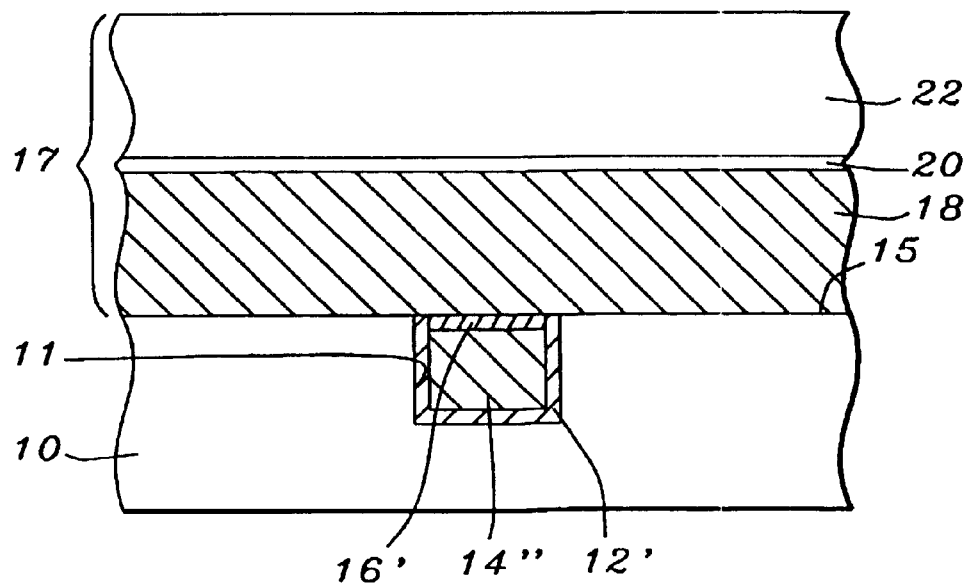

As shown in FIG. 6, a dielectric layer stack 17 may then be formed over the substrate 10 and the planarized barrier cap layer 16'/recessed copper line/via 14". Dielectric layer stack 17 may comprise a lower first dielectric layer 18 and an upper second dielectric layer 22 separated by a dielectric barrier layer 20. First and second dielectric layers 18, 22 may be intermetal dielectric (IMD) layers.

Dielectric barrier layer 20 is preferably comprised of SiN, SiC or SiCO and is more preferably SiC. Dielectric barrier layer 20 has a thickness of preferably from about 200 to 1000 Å and more preferably from about 300 to 600 Å.

Formation of Dual Damascene Structure 30

Figure 7:
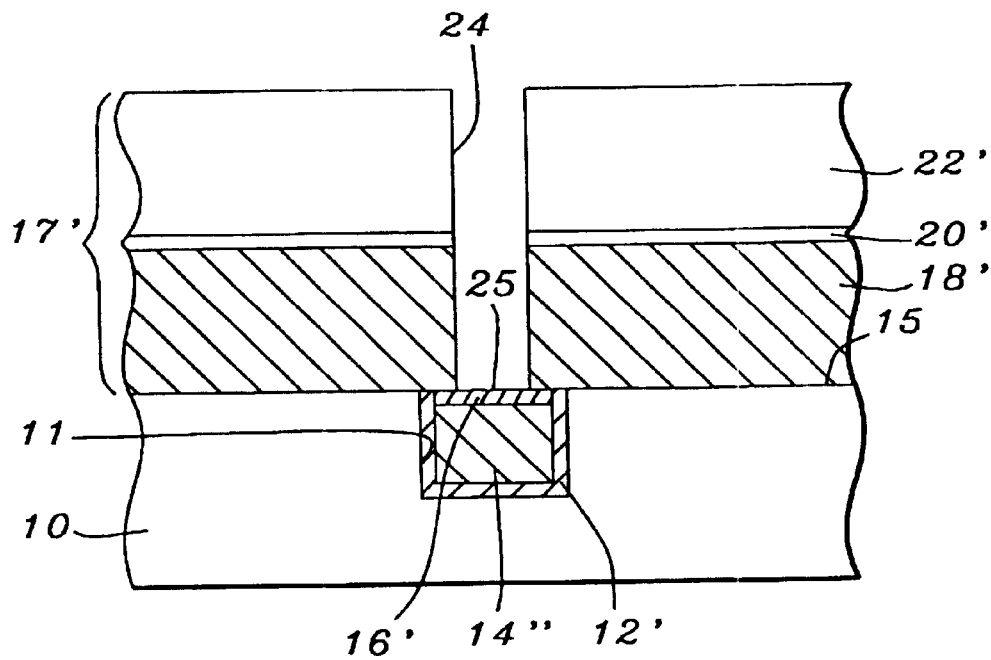

As shown in FIG. 7, a via opening 24 is then formed through the upper second dielectric layer 22, dielectric barrier layer 20 and lower first dielectric layer 18 to exposed at least a portion 25 of the planarized barrier cap layer 16' overlying the recessed copper line/via 14". Via opening 24 is preferably from about 1500 to 2500 Å wide and more preferably from about 1600 to 1800 Å wide.

Figure 8:
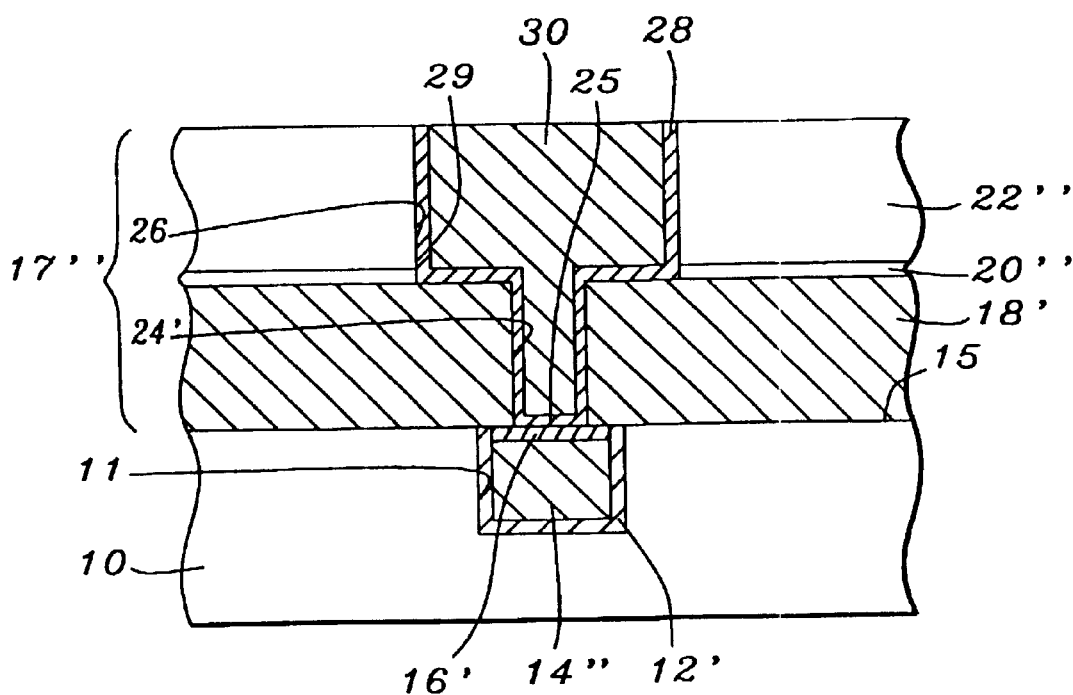

As shown in FIG. 8, the upper second dielectric layer 22' and dielectric barrier layer 20' are patterned to form a trench opening 26 over the remaining via opening 24' within the lower first dielectric layer 18'. Trench opening 26 has a width of preferably from about 1500 to 3000 Å and more preferably from about 1000 to 2500 Å. Trench opening 26 and the remaining via opening 24' form dual damascene opening 29.

A dual damascene barrier layer 28 is formed over the patterned upper second dielectric layer 22", lining the dual damascene opening 29 and the exposed portion 25 of the planarized barrier cap layer 16' Dual damascene barrier layer 28 is preferably comprised of tantalum (Ta), tantalum/tantalum nitride (Ta/TaN), TaN, TiN, W, Ti/W or WN is more preferably Ta or Ta/TaN and is most preferably Ta. Dual damascene barrier layer 28 has a thickness of preferably from about 100 to 500 Å and more preferably from about 200 to 350 Å.

A metal layer is then formed over the dual damascene barrier layer 28 covered patterned upper second dielectric layer 22", filling the dual damascene opening 29. The excess of the metal layer and the excess of the dual damascene overlying the patterned upper second dielectric layer 22" are removed by a planarization process to form a planarized dual damascene metal structure 30 within the dual damascene opening 29. The metal layer is preferably planarized using a chemical mechanical polishing (CMP) process. The metal layer is preferably comprised of copper, Cu(Sn), Cu(Mg) or a copper alloy and is more preferably copper.

Advantages of the Invention

The advantages of one or more embodiments of the present invention include:

1) better EM reliability (electromigration and stress migration);
2) prevention against Cu corrosion (either by galvanic or photo-assisted); and
3) prevention against Cu voids due to thermal loading of film depositions.

While particular embodiments of the present invention have been illustrated and described, it is not intended to limit the invention, except as defined by the following claims.

We claim:

1. A method of fabricating a planarized barrier cap layer over a metal structure, comprising the steps of:
   providing a substrate having an opening formed therein; the substrate having an upper surface;
   forming a planarized metal structure within the opening; the planarized metal structure being substantially planar with the upper surface of the substrate; removing a portion of the planarized metal structure using a reverse-electrochemical plating process to recess the metal structure from the upper surface of the substrate;
   forming a barrier cap layer over the substrate and the recessed metal structure; and
   removing the excess of the barrier cap layer from over the substrate by a planarization process to form the planarized barrier cap layer over the metal structure.

2. The method of claim 1, wherein substrate is a silicon substrate.

3. The method of claim 1, wherein the substrate is a semiconductor wafer or a semiconductor substrate.

4. The method of claim 1, wherein the opening is a line opening or a via opening.

5. The method of claim 1, wherein the planarized metal structure is comprised of copper, a copper alloy, Cu(Sn) or Cu(Mg).

6. The method of claim 1, wherein the planarized metal structure is comprised of copper.

7. The method of claim 1, wherein a line/via barrier layer is interposed between the planarized metal structure and the opening.

8. The method of claim 1, wherein a line/via barrier layer is interposed between the planarized metal structure and the opening; the line/via barrier layer being comprised of Ta, Ta/TaN, TaN, TiN, Ti/W, W or WN.

9. The method of claim 1, wherein a line/via barrier layer is interposed between the planarized metal structure and the opening; the line/via barrier layer being comprised of Ta or Ta/TaN.

10. The method of claim 1, wherein a line/via barrier layer is interposed between the planarized metal structure and the opening; the line/via barrier layer being comprised of Ta.

11. The method of claim 1, wherein the planarized metal structure is formed by:
    forming a metal layer over the substrate, filling the opening, using an electrochemical plating process; and
    planarizing the metal layer to form the planarized metal structure.

12. The method of claim 1, wherein the planarized metal structure is planarized using a chemical mechanical polishing process.

13. The method of claim 1, wherein the metal structure is recessed from the upper surface of the substrate by from about 100 to 500 Å.

14. The method of claim 1, wherein the metal structure is recessed from the upper surface of the substrate by from about 200 to 350 Å.

15. The method of claim 1, wherein the planarized barrier cap layer is substantially planar with the upper surface of the metal structure.

16. The method of claim 1, wherein the barrier cap layer is comprised of Ta, Ta/TaN, TaN, TiN, Ti/W, W or WN.

17. The method of claim 1, wherein the barrier cap layer is comprised of Ta or Ta/TaN.

18. The method of claim 1, wherein the barrier cap layer is comprised of Ta.

19. The method of claim 1, wherein a top layer is formed over the barrier cap layer before planarization of the barrier cap layer.

20. The method of claim 1, wherein a top layer is formed over the barrier cap layer before planarization of the barrier cap layer to improve the subsequent planarization of the barrier cap layer.

21. The method of claim 1, wherein a top layer is formed over the barrier cap layer before planarization of the barrier cap layer; the top layer being comprised of Cu, Cu(Sn), Cu(Mg) or a copper alloy.

22. The method of claim 1, wherein a top layer is formed over the barrier cap layer before planarization of the barrier cap layer; the top layer being comprised of copper.

23. The method of claim 1, including the subsequent step of forming a dual damascene structure over, and in contact with, the planarized barrier cap layer.

24. A method of fabricating a planarized barrier cap layer over a metal structure, comprising the steps of:
   providing a substrate having an opening formed therein; the substrate having an upper surface;
   forming a planarized metal structure within the opening; the planarized metal structure being substantially planar with the upper surface of the substrate; the planarized metal structure being comprised of copper, a copper alloy, Cu(Sn) or Cu(Mg);
   removing a portion of the planarized metal structure using a reverse-electrochemical plating process to recess the metal structure from the upper surface of the substrate;
   forming a barrier cap layer over the substrate and the recessed metal structure; the barrier cap layer being comprised of Ta, Ta/TaN, TaN, TiN, Ti/W, W or WN; and
   removing the excess of the barrier cap layer from over the substrate by a planarization process to form the planarized barrier cap layer over the metal structure, the planarized barrier cap layer being substantially planar with the upper surface of the substrate.

25. The method of claim 24, wherein substrate is a silicon substrate.

26. The method of claim 24, wherein the substrate is a semiconductor wafer or a semiconductor substrate.

27. The method of claim 24, wherein the opening is a line opening or a via opening.

28. The method of claim 24, wherein the planarized metal structure is comprised of copper.

29. The method of claim 24, wherein a line/via barrier layer is interposed between the planarized metal structure and the opening.

30. The method of claim 24, wherein a line/via barrier layer is interposed between the planarized metal structure and the opening; the line/via barrier layer being comprised of Ta, Ta/TaN, TaN, TiN, Ti/W, W or WN.

31. The method of claim 24, wherein a line/via barrier layer is interposed between the planarized metal structure and the opening; the line/via barrier layer being comprised of Ta or Ta/TaN.

32. The method of claim 24, wherein a line/via barrier layer is interposed between the planarized metal structure and the opening; the line/via barrier layer being comprised of Ta.

33. The method of claim 24, wherein the planarized metal structure is formed by:
   forming a metal layer over the substrate, filling the opening, using an electrochemical plating process; and
   planarizing the metal layer to form the planarized metal structure.

34. The method of claim 24, wherein the planarized metal structure is planarized using a chemical mechanical polishing process.

35. The method of claim 24, wherein the metal structure is recessed from the upper surface of the substrate by from about 100 to 500 Å.

36. The method of claim 24, wherein the metal structure is recessed from the upper surface of the substrate by from about 200 to 350 Å.

37. The method of claim 24, wherein the barrier cap layer is comprised of Ta or Ta/TaN.

38. The method of claim 24, wherein the barrier cap layer is comprised of Ta.

39. The method of claim 24, wherein a top layer is formed over the barrier cap layer before planarization of the barrier cap layer.

40. The method of claim 24, wherein a top layer is formed over the barrier cap layer before planarization of the barrier cap layer to improve the subsequent planarization of the barrier cap layer.

41. The method of claim 24, wherein a top layer is formed over the barrier cap layer before planarization of the barrier cap layer; the top layer being comprised of Cu, Cu(Sn), Cu(Mg) or a copper alloy.

42. The method of claim 24, wherein a top layer is formed over the barrier cap layer before planarization of the barrier cap layer; the top layer being comprised of copper.

43. The method of claim 24, including the subsequent step of forming a dual damascene structure over, and in contact with, the planarized barrier cap layer.

44. A method of encapsulating a copper structure, comprising the steps of:
   providing a substrate having an opening formed therein; the substrate having an upper surface;
   forming a planarized copper structure within the opening; the planarized copper structure being substantially planar with the upper surface of the substrate;
   removing a portion of the planarized copper structure using a reverse-electrochemical plating process to recess the copper structure from the upper surface of the substrate; and
   forming a barrier cap layer over the substrate and the recessed copper structure to encapsulate the copper structure, the barrier cap layer being substantially planar with the upper surface of the substrate.

45. The method of claim 44, wherein substrate is a silicon substrate.

46. The method of claim 44, wherein the substrate is a semiconductor wafer or a semiconductor substrate.

47. The method of claim 44, wherein the opening is a line opening or a via opening.

48. The method of claim 44, wherein the planarized copper structure is comprised of copper, a copper alloy, Cu(Sn) or Cu(Mg).

49. The method of claim 44, wherein a line/via barrier layer is interposed between the planarized copper structure and the opening.

50. The method of claim 44, wherein a line/via barrier layer is interposed between the planarized copper structure and the opening; the line/via barrier layer being comprised of Ta, Ta/TaN, TaN, TiN, Ti/W, W or WN.

51. The method of claim 44, wherein a line/via barrier layer is interposed between the planarized copper structure and the opening; the line/via barrier layer being comprised of Ta or Ta/TaN.

52. The method of claim 44, wherein a line/via barrier layer is interposed between the planarized copper structure and the opening; the line/via barrier layer being comprised of Ta.

53. The method of claim 44, wherein the planarized copper structure is formed by:

forming a copper layer over the substrate, filling the opening, using an electrochemical plating process; and planarizing the copper layer to form the planarized copper structure.

54. The method of claim 44, wherein the planarized copper structure is planarized using a chemical mechanical polishing process.

55. The method of claim 44, wherein the copper structure is recessed from the upper surface of the substrate by from about 100 to 500 Å.

56. The method of claim 44, wherein the copper structure is recessed from the upper surface of the substrate by from about 200 to 350 Å.

57. The method of claim 44, wherein the barrier cap layer is comprised of Ta, Ta/TaN, TaN, TiN, Ti/W, W or WN.

58. The method of claim 44, wherein the barrier cap layer is comprised of Ta or Ta/TaN.

59. The method of claim 44, wherein the barrier cap layer is comprised of Ta.

60. The method of claim 44, including the steps of:

forming a top layer over the barrier cap layer; and then planarizing the barrier cap layer to remove the excess of the barrier cap layer.

61. The method of claim 44, including the steps of:

forming a top layer over the barrier cap layer to improve the subsequent planarization of the barrier cap layer; and then planarizing the barrier cap layer to remove the excess of the barrier cap layer.

62. The method of claim 44, including the steps of:

forming a top layer over the barrier cap layer; the top layer being comprised of Cu, Cu(Sn), Cu(Mg) or a copper alloy; and then planarizing the barrier cap layer to remove the excess of the barrier cap layer.

63. The method of claim 44, including the steps of:

forming a top copper layer over the barrier cap layer; and then planarizing the barrier cap layer to remove the excess of the barrier cap layer.

64. The method of claim 44, including the subsequent step of forming a dual damascene structure over, and in contact with, the barrier cap layer.

* * * * *

UNITED STATES PATENT AND TRADEMARK OFFICE
CERTIFICATE OF CORRECTION

PATENT NO. : 6,706,625 B1
DATED : March 16, 2004
INVENTOR(S) : John Sudijono, Liang Choo Hsia and Liu Wu Ping It is certified that error appears in the above-identified patent and that said Letters Patent is hereby corrected as shown below:

Title page,
Item [75], Inventors, delete "Liang Ch O Hsia", and replace with -- Liang Choo Hsia --.

Signed and Sealed this

Twelfth Day of October, 2004

JON W. DUDAS
*Director of the United States Patent and Trademark Office*